(12) United States Patent
Zelenka

(10) Patent No.: US 6,836,343 B1
(45) Date of Patent: Dec. 28, 2004

(54) METHOD AND CIRCUIT ARRANGEMENT FOR DRIVING LASER DIODES

(75) Inventor: Thomas Zelenka, Mönkeberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 911 days.

(21) Appl. No.: 09/655,548

(22) Filed: Sep. 6, 2000

(30) Foreign Application Priority Data

Sep. 7, 1999 (DE) .......................................... 199 42 551

(51) Int. Cl.[7] .............................................. G06F 15/00
(52) U.S. Cl. ........................ 358/1.7; 358/509; 358/513
(58) Field of Search .......................... 358/1.7, 1.8, 509, 358/510, 513, 514, 475

(56) References Cited

U.S. PATENT DOCUMENTS 5,530,688 A * 6/1996 Hurst, Jr. et al.

FOREIGN PATENT DOCUMENTS

DE 38 04 452 * 5/1994

EP 0 713 214 * 5/1996

OTHER PUBLICATIONS

Japanese Abstracts of Japan –4–141837.*

* cited by examiner

*Primary Examiner*—Mark Wallerson
(74) *Attorney, Agent, or Firm*—Schiff Hardin LLP

(57) ABSTRACT

In a method and a circuit arrangement for driving laser diodes arranged in close proximity to one another in a laser recording device, video signals modulated with the information to be recorded generate driver currents for the laser diodes. The light powers output by the laser diodes drop due to crosstalk between the laser diodes. For compensation of the crosstalk, correction units are connected between first laser diodes that form crosstalk sources and second laser diodes that form crosstalk sinks. In the correction units, the driver currents of the first laser diodes are converted into correction signals according to the transfer functions of the correction units, the correction signals correcting the driver currents of the second laser diodes such that the crosstalk is compensated. For determining the transfer functions of the correction units, the time curves of the light powers in the crosstalk sinks are measured and approximately electrically simulated as transfer functions.

13 Claims, 4 Drawing Sheets

METHOD AND CIRCUIT ARRANGEMENT FOR DRIVING LASER DIODES

BACKGROUND OF THE INVENTION

The invention is in the field of electronic reproduction technology and is directed to a method and a circuit arrangement for driving laser diodes arranged in close proximity to one another, for example on a common carrier, in laser recording devices, whereby the term laser recording devices is intended to include laser exposers, laser printers and digital printing machines, among others.

In a laser recording device, a laser beam modulated by a video signal is conducted point-by-point and line-by-line across a recording material that is clamped on a materials' holder movable relative to the laser beam.

Multi-beam recording elements are employed for increasing the recording speed. A multi-beam recording element comprises a plurality of individually controllable laser diodes that generate a plurality of parallel laser beams for the recording.

Strip-shaped laser diode arrangements, what are referred to as laser diode bars, are frequently employed, these being respectively composed of a plurality of laser diodes arranged in close proximity on a shared substrate carrier that have individually electrically drivable emitters.

Since the light power output by the laser diodes is highly temperature-dependant, the heating of a laser diode—due to the extremely slight spacings of the laser diodes on the substrate carrier—can disturbingly influence the temperatures of neighboring laser diodes and, thus, their light power, an effect that is referred to as thermal crosstalk. Due to the slight spacings of the laser beams from one another, further, neighboring laser beams can mutually influence one another, an effect that is called optical crosstalk. The recording quality of a laser recording device is considerably deteriorated due to such crosstalk.

For crosstalk compensation in laser diode arrangements, it is know to either keep the working temperature of the individual laser diodes constant by heating and cooling or to keep the light powers output by the laser diodes constant by regulating their driver currents.

EP 0 738 071 B discloses a method for the operation of a laser diode arrangement wherein correction signals are formed by weighting selected video signals with weighting coefficients stored in a table memory (look-up table; LUT). For the purpose of a crosstalk compensation, the video signals are corrected by the correction signals and the corrected video signals are then converted into the driver currents for the laser diodes.

The known method does not take into consideration that the thermal crosstalk is dynamic, i.e. that the temperature influencing on neighboring diodes occurs with a time curve. For this reason, the known method is not suited for being utilized for fast modulation of the laser beams in a laser recording device.

SUMMARY OF THE INVENTION

It is therefore an object of the present invention to improve a method and a circuit arrangement for driving laser diodes arranged in close proximity in a laser recording device such that thermal and optical crosstalk of the laser diodes are dynamically compensated.

According to the method and apparatus of the invention for driving laser diodes arranged in close proximity to one another in a laser recording device, each laser diode is charged by a driver current that determines a light power output by the laser diode. With the driver currents, controlling video signals modulated with information to be recorded are controlled. A first correction unit is connected between a first laser diode forming a crosstalk source and a second laser diode forming a crosstalk sink. The correction unit is charged with the video signal or the driver current of the first laser diode. The correction unit is connected with the video signal or the driver current of the first laser diode. An output signal of the correction unit is employed as a correction signal for the video signal or for the driver current of the second laser diode. A transfer function of the correction unit is determined such that an optimum compensation of crosstalk is achieved between the laser diodes.

The invention is explained in greater detail below with reference to FIGS. 1 through 4.

DESCRIPTION OF THE PREFERRED EMBODIMENTS

Figure 1:
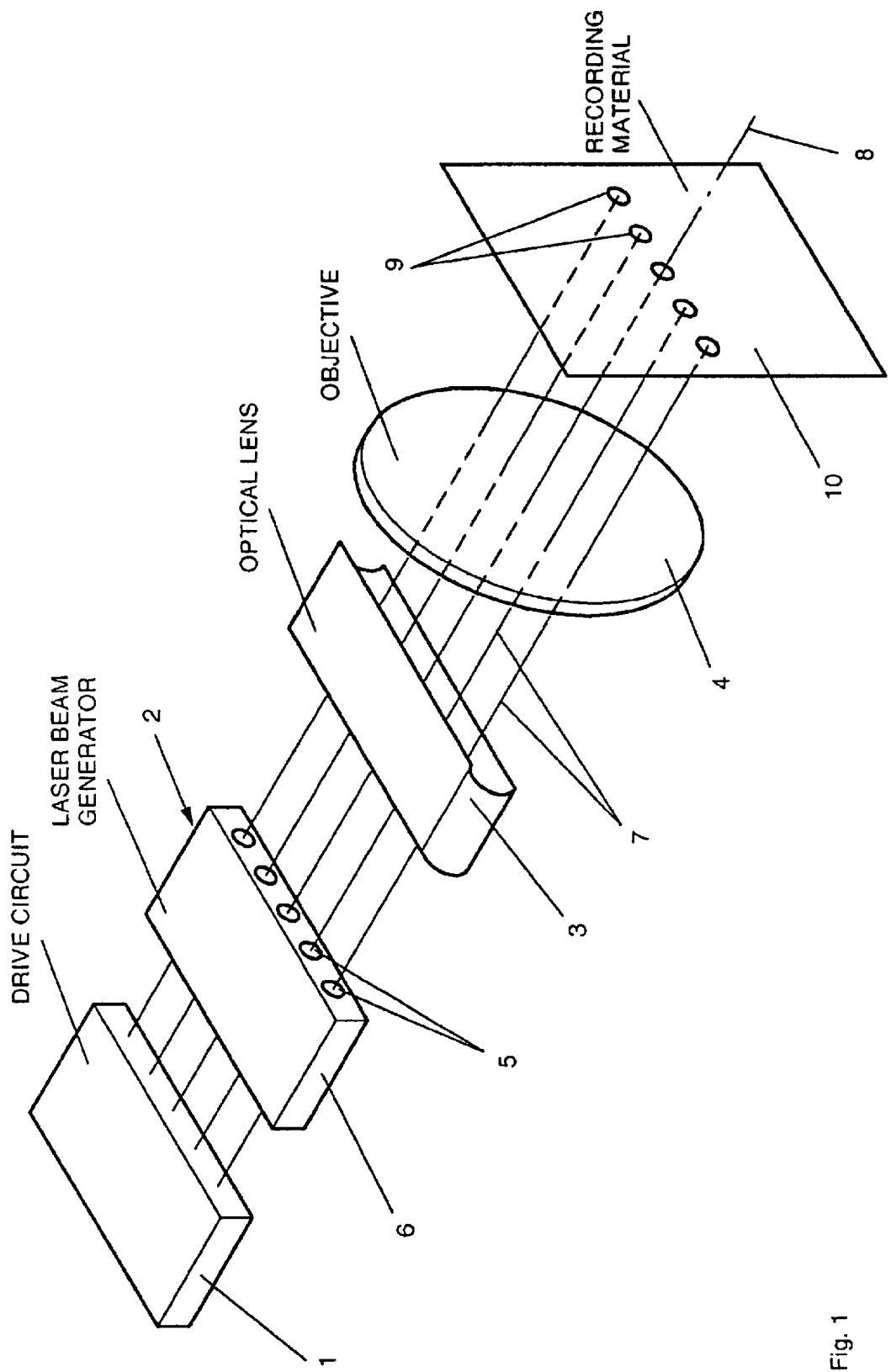
FIG. 1 is a schematic illustration of a multi-beam recording element.

FIG. 1 shows a schematic exemplary embodiment of a multi-beam recording element in a laser recording device. The multi-beam recording element essentially comprises a drive circuit 1, a laser beam generator 2, an optical lens 3 and an objective 4. The laser beam generator 2 is designed as a strip-shaped laser diode arrangement, called a laser diode bar in brief. The strip-shaped laser diode arrangement is composed of a plurality —five in the illustration—of laser diodes 5 arranged in a row and spaced from one another. The laser diodes 5, whose emitters can be individually driven with the drive circuit 1, are located on a common substrate carrier 6. The substrate carrier 6 is arranged such that the laser beams 7 generated by the laser diodes 5 emerge from the laser beam generator 2 parallel to an optical axis 8 of the multi-beam recording element.

The optical lens 3 in front of the laser beam generator 2 is designed as an aspherical lens, for example a cylindrical meniscus lens, whose longitudinal extent is directed perpendicular to the optical axis 8. An asymmetrical beam expansion transverse to the optical axis 8 is compensated by the cylindrical meniscus lens 3.

The objective 4 is arranged on the optical axis 8 at that side of the optical lens 3 facing away from the laser beam generator 2. The objective 4 forms the individual light exit faces of the laser diodes 5 in the required scale as a row of illumination points 9 on the recording material 10 of the laser recording device (not shown in greater detail). The illumination points 9 generate illumination lines lying side-by-side on the recording material 10 due to a relative movement between recording material and multi-beam recording element.

Figure 2:
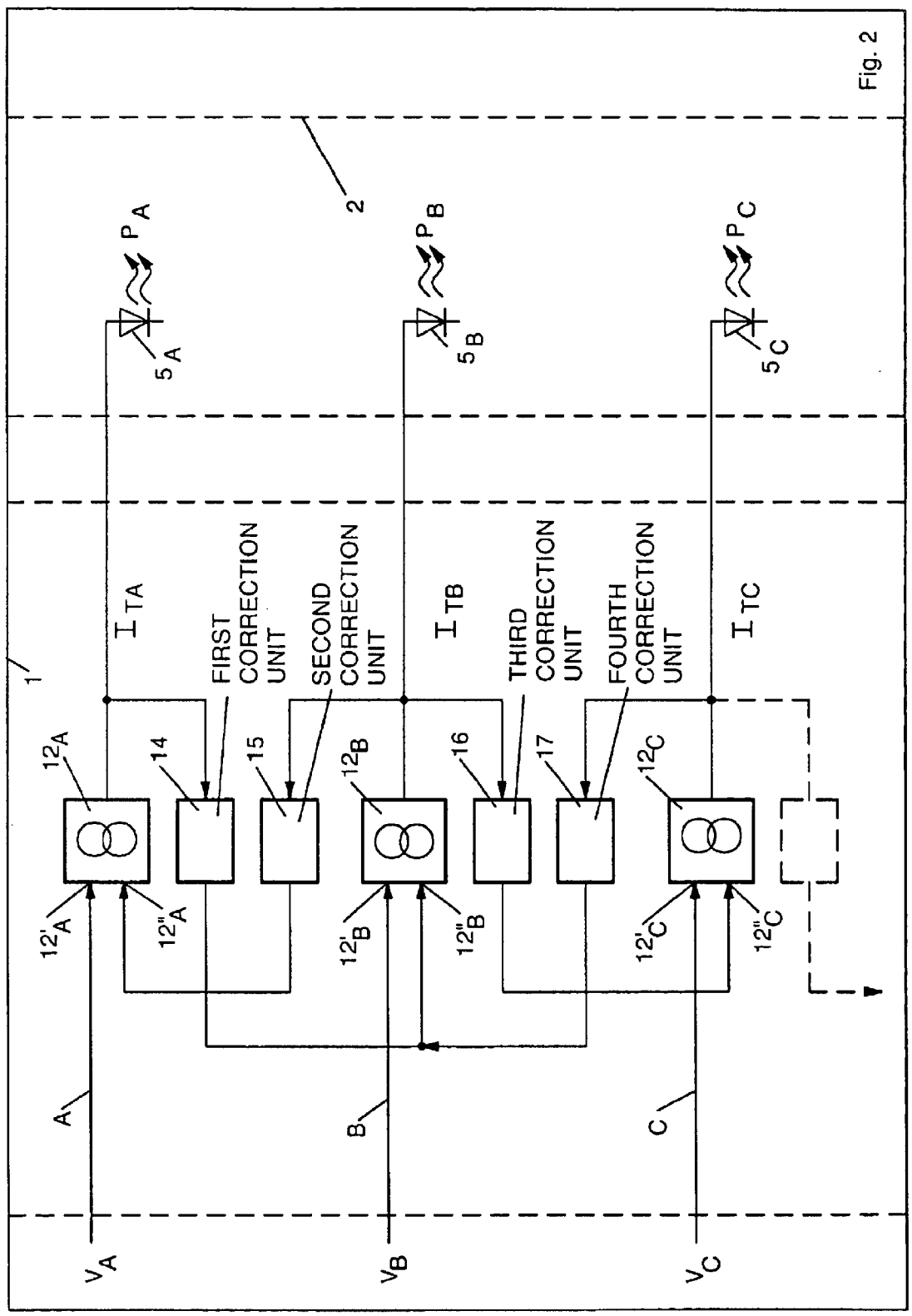
FIG. 2 is an exemplary embodiment of a drive circuit.

FIG. 2 shows an exemplary embodiment of a drive circuit 1 for the laser beam generator 2 that is designed as a strip-shaped laser diode arrangement (laser diode bar) according to FIG. 1. For the sake of clarity, only three specific laser diodes ($5_A$, $5_B$, $5_C$) of the laser diode arrangement are shown for three channels A, B and C in FIG. 2. The illustrated arrangement is repeated correspondingly given more channels.

The channels A, B and C comprise controllable current sources $12_A$, $12_B$, $12_C$ for generating the driver currents $I_{TA}$, $I_{TB}$, $I_{TC}$ for the laser diodes $5_A$, $5_B$, $5_C$ with a respective control input $12'_A$, $12'_B$, $12'_C$, and a correction input $12''_A$, $12''_B$, $12''_C$.

Analog or digital video signals $V_A$, $V_B$, and $V_C$ that are modulated with the information to be recorded are supplied to the control inputs $12'_A$, $12'_B$, $12'_C$ of the current sources $12_A$, $12_B$, $12_C$ and control the light powers $P_A$, $P_B$ and $P_C$ of the laser diodes $5_A$, $5_B$, $5_C$ via the driver currents $I_{TA}$, $I_{TB}$, $I_{TC}$.

As already explained, the working temperature of a laser diode (crosstalk source) in one of the channels influences the working temperatures of the laser diodes (crosstalk sink) in the neighboring channels time-delayed by thermal crosstalk as a result of the laser diodes lying in such close proximity to one another and, due to the dependency of the light power on the working temperature, also influences the light powers output by the laser diodes. Additionally, the light power can be influenced by optical crosstalk of the laser beams.

In FIG. 2, for example, the working temperature of the laser diode $5_A$ in the channel A influences the working temperature of the laser diode $5_B$ in the neighboring channel B, and the working temperature of the laser diode $5_B$ in the channel B influences the corresponding working temperatures of the laser diodes $5_A$, $5_C$ in the neighboring channels A and C.

The disruptive thermal and optical crosstalk of the channels onto neighboring channels is compensated according to the invention by electronic feedback of correction signals K onto at least the immediately neighboring channels. The correction signals K for neighboring channels are acquired from the video signal V or from the driver current $I_T$ of the channel lying between the neighboring channels. The acquisition of the correction signals K occurs with linear or non-linear correction units whose transfer functions correspond to the time curves of the temperature T=f(t) or the light power P=f(t) in at least the immediately neighboring channels caused by the crosstalk.

The method of the invention is explained by way of example for the crosstalk compensation of the channel A onto the neighboring channel B.

Before the crosstalk compensation, the time curve of the temperature $T_B$=f(t) or the time curve of the light power $P_B$=f(t) in the neighboring channel B is determined, this deriving due to the crosstalk effect from channel A onto channel B. The determination of the time curve of the light power has the advantage that both the thermal as well as the optical crosstalk are covered.

For this purpose, the channel A is charged with a video signal pulse $V_A$ and the channel B is charged with a constant video signal $V_B$, so that the channel A works in switched mode and the channel B works in continuous mode. Due to activation of the laser diode $5_A$ in the channel A, the working temperature thereof is increased. The laser diode $5_B$ in the neighboring channel B heats in time-delayed fashion due to the thermal crosstalk and its light power $P_B$ drops with the time as a consequence of the heating. The time curve of the temperature $T_B$=f(t) or of the light power $P_B$=f(t) in the channel B is then measured.

Subsequently, the time curve of the temperature $T_B$ f(t) of the laser diode $5_B$ or of the light power $P_B$=f(t) is simulated by an electrical correction unit and is input into a first correction unit 14. The correction unit can be designed as a linear low-pass that—in the simplest case—is constructed of an RC element, preferably of a combination of RC elements. The determination of "R" and "C" of the RC elements occurs by polynomial approximation according to known calculating methods. The required time curve of the driver current $I_B$=f(t) is determined and employed for the scaling of the transfer function of the correction unit, being determined from the known relationship between the light power P and the driver current $I_B$, which is assumed to be approximately linear at least in the operating range, and from the measured function $P_B$=f(t).

In the crosstalk compensation, a correction signal $K_{AB}$ is then generated in the first correction unit 14 from the video signal $V_A$ or, respectively, from the driver current $I_{TA}$, the correction signal being forwarded to the correction input $12''_B$ of the current source $12_B$ for the correction of the driver current $I_{TB}$. The correction signal $K_{AB}$ corresponds to the time change of the temperature or of the light power in the channel B dependent on the video signal $V_A$ or on the driver current $I_{TA}$ of the channel A. The correction signal $K_{AB}$ corrects the driver current of the laser diode $5_B$ in the channel B in such a way that the drop of the light power $P_B$ in the channel B caused by the crosstalk is compensated, whereby the relationship between driver current and light power is assumed to be approximately linear.

In the drive circuit 1 shown in FIG. 2, moreover, a correction signal $K_{BA}$ acting from channel B onto channel A is acquired in a second correction unit 15, a correction signal $K_{BC}$ acting from channel B onto channel C is acquired in a third correction unit 16, and a correction signal $K_{CB}$ acting from the channel C onto channel B is acquired in a fourth correction unit 17.

Figure 3:
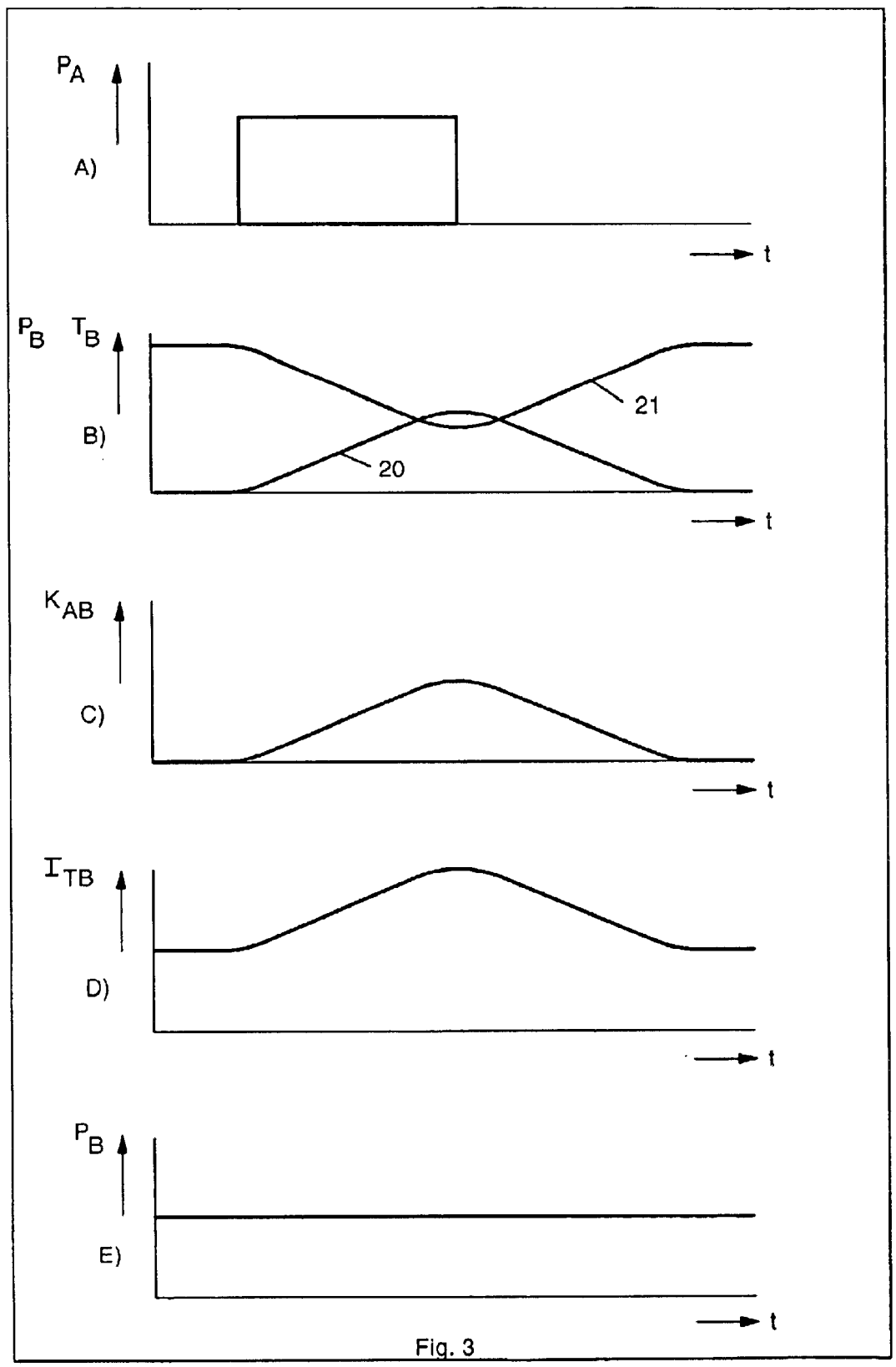
FIG. 3 shows time curves, for example explaining a crosstalk compensation.

FIG. 3 shows time curves for explaining the compensation of the crosstalk from channel A onto channel B.

Time diagram A) shows the rectangular curve of the light power $P_A$ in the channel A during the on-time interval of the laser diode $5_A$.

Time diagram B) shows the curve (20) of the working temperature $T_B$ as well as the curve 21 of the light power $P_B$ of the laser diode $5_B$ in the channel B resulting due to the crosstalk from channel A. The drop in light power caused by the crosstalk can be seen.

Time diagram C) shows the correction signal $K_{AB}$ generated for the channel B for the compensation of the crosstalk from channel A onto channel B.

Time diagram D) shows the curve of the driver current $I^*_{TB}$ for the laser diode $5_B$ in the channel b corrected with the correction signal $K_{AB}$.

The time diagram E) shows the curve of the light power $P_B$ of the laser diode $5_B$ in the channel B after the crosstalk compensation, the disruptive drop in light power having now been eliminated.

In the exemplary embodiment of a drive circuit ( ) shown in FIG. 2, the crosstalk from one channel onto the immediately neighboring channels is compensated.

It lies within the scope of the invention to expand the crosstalk compensation onto more distant channels, for example to compensate the crosstalk of channel A not only in the immediately neighboring channel B but also in the more distant channel C.

Figure 4:
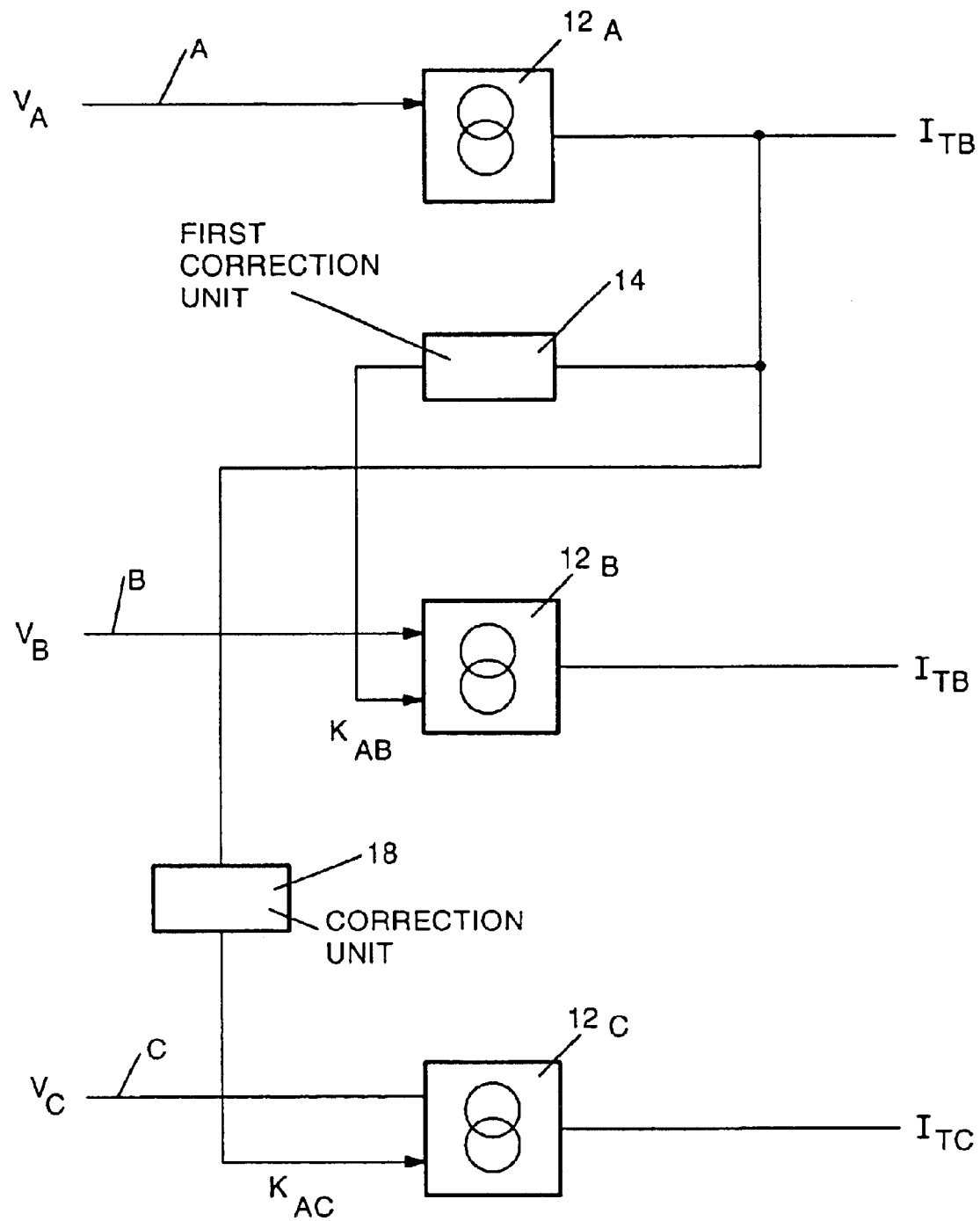
FIG. 4 is another exemplary embodiment of a drive circuit.

FIG. 4 shows portions of a drive circuit 1 for an expanded crosstalk compensation. For additional compensation of the crosstalk from channel A onto channel C, the illustrated drive circuit 1 comprises a further correction unit 18 in which the time curve of the temperature $T_C=f(t)$ of the laser diode $5_C$ or of the light power $P_C=f(t)$ in the channel C as a result of a temperature change of the laser diode $5_A$ is simulated. Dependent on the driver current $I_{TA}$, the correction unit 18 generates an additional correction signal $K_{AC}$ that is supplied to the current source $12_C$ for the correction of the driver current $I_{TC}$ for the laser diode $5_C$.

Although various minor modifications might be suggested by those skilled in the art, it should be understood that my wish to embody within the scope of the patent warranted hereon all such modifications as reasonably and properly come with the scope of my contribution to the art.

I claim as my invention:

1. A method for driving laser diodes arranged in close proximity to one another in a laser recording device, comprising the steps of:

charging each laser diode by a driver current that determines a light power output by the laser diode;

with the driver currents, controlling video signals modulated with information to be recorded;

connecting a correction unit between a first laser diode forming a crosstalk source and a second laser diode forming a crosstalk sink;

controlling the correction unit with the video signal or the driver current of the first laser diode;

employing an output signal of the correction unit as a correction signal for the video signal or for the driver current of the second laser diode; and determining a transfer function of the correction unit such that an optimum compensation of crosstalk is achieved between the laser diodes.

2. The method according to claim 1, for determining the transfer function of the correction unit wherein a time curve of a temperature of the second laser diode forming the crosstalk sink that arises as a consequence of the crosstalk is determined; and the identified time curve of the temperature is approximately electrically simulated by the correction unit as the transfer function.

3. The method according to claim 1, wherein for determining the transfer function of the correction unit a time curve of a light power of the second laser diode forming the crosstalk sink that arises as a consequence of the crosstalk is determined; and the identified time curve of the light power is approximately electrically simulated by the correction unit as the transfer function.

4. The method according to claim 1 wherein for determining a time curve of a temperature or of a light power turning on and off the first laser diode forming the crosstalk source by a driver current pulse;

operating the second laser diode forming the crosstalk sink in continuous mode by a constant driver current;

measuring the time curve of the temperature or of the light power of the second laser diode dependent on the time as a first function; and the time curve of the driver current of the second laser diode is determined from the first function and a second function that reproduces the curve of the light power of the second laser diode dependent on the driver current.

5. The method according to claim 1 wherein the connection unit is electrically realized by a linear low-pass filter having at least one RC element.

6. The method according to claim 1 wherein the laser diodes forming the crosstalk sinks are those laser diodes that at least immediately neighbor the laser diode forming the crosstalk source.

7. The method according to claim 1 wherein a correction unit is allocated to every crosstalk sink to be taken into consideration for a crosstalk source;

transfer functions of the correction units are formed from characteristic time curves of a temperature or light power in the respective crosstalk sinks;

the correction units are charged with the driver current of the laser diode forming the crosstalk source; and output signals of the correction units are respectively employed as correction signals for the video signals or the driver currents of the laser diodes forming the crosstalk sinks.

8. The method according to claim 1 wherein the driver currents for the laser diodes are generated in current sources that are controlled by the video signals and the correction signals.

9. A circuit arrangement for driving laser diodes arranged in close proximity to one another in a laser recording device, comprising:

generators controlled by video signals for generating driver currents for the laser diodes that determine light powers output by the laser diodes;

correction units for generating correction signals for compensation of crosstalk between the laser diodes;

the correction units dependent on the video signals or driver currents for the laser diodes, approximately electrically simulating time curves of the temperatures or light powers of the individual laser diodes arising as a consequence of the crosstalk; and outputs of the correction units are connected to the generators in order to correct the video signals or driver currents with the correction signals.

10. The circuit arrangement according to claim 9 wherein the generators are current sources driven by the video signals.

11. The circuit arrangement according to claim 9 wherein the correction units are designed as linear low-pass filters.

12. A method for driving laser diodes arranged adjacent to one another in a laser recording device, comprising the steps of:

connecting each laser diode with a driver current related to a light power output by the laser diode;

with the driver currents, controlling video signals modulated with information to be recorded;

connecting a correction unit between a first laser diode forming a crosstalk source and a second laser diode forming a crosstalk sink;

controlling the correction unit with at least one of the video signal and the driver current of the first laser diode;

employing an output signal of the correction unit as a correction signal for at least one of the video signal and driver current of the second laser diode; and determining a transfer function of the correction unit such that compensation of crosstalk is achieved between the laser diodes.

13. A circuit arrangement for driving laser diodes arranged adjacent to one another in a laser recording device, comprising:

generators controlled by video signals for generating driver currents for the laser diodes that determine light powers output by the laser diodes;

correction units for generating correction signals for compensation of crosstalk between the laser diodes;

the correction units dependent on at least one of the video signals and driver currents, approximately electrically simulating time curves of at least one of the temperatures and light powers of the individual laser diodes arising as a consequence of the crosstalk;

the correction units are connected with at least one of the video signals and the driver currents for the laser diodes; and outputs of the correction units are connected to the generators in order to correct at least one of the video signals and the driver currents with the correction signals.

* * * * *